United States Patent
Rozental et al.

(10) Patent No.: US 10,637,397 B2
(45) Date of Patent: Apr. 28, 2020

(54) METHOD AND APPARATUS FOR DETERMINING A CLOCK FREQUENCY FOR AN ELECTRONIC PROCESSOR

(71) Applicant: MOTOROLA SOLUTIONS, INC., Chicago, IL (US)

(72) Inventors: Mark Rozental, Gedera (IL); Claudine Tordjman, Holon (IL); Richard S. Young, Weston, FL (US); Uri Vallach, Petach-Tikva (IL)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 92 days.

(21) Appl. No.: 15/672,251

(22) Filed: Aug. 8, 2017

(65) Prior Publication Data

US 2019/0052226 A1    Feb. 14, 2019

(51) Int. Cl.
| | |
|---|---|
| H03L 1/02 | (2006.01) |
| H03L 7/085 | (2006.01) |
| H03B 5/36 | (2006.01) |
| H03L 7/06 | (2006.01) |
| H03L 7/24 | (2006.01) |
| H03K 3/03 | (2006.01) |
| H03L 7/10 | (2006.01) |
| H03L 7/099 | (2006.01) |
| H03L 7/18 | (2006.01) |

(Continued)

(52) U.S. Cl.
CPC .............. *H03B 5/36* (2013.01); *H03K 3/0315* (2013.01); *H03L 7/06* (2013.01); *H03L 7/085* (2013.01); *H03L 7/0995* (2013.01); *H03L 7/101* (2013.01); *H03L 7/18* (2013.01); *H03L 7/24* (2013.01); *H01R 13/646* (2013.01); *H03B 5/1271* (2013.01); *H03L 1/02* (2013.01)

(58) Field of Classification Search
CPC . H03L 1/02; H03L 1/022; H03L 1/023; H03L 1/025; H03L 1/026; H03L 7/06; H03L 7/08; H03L 7/085; H03L 7/093; H03L 7/0995; H03L 7/104; H03L 7/1072
See application file for complete search history.

(56) References Cited

U.S. PATENT DOCUMENTS 6,544,807 B1    4/2003 Bach
9,083,356 B1 *  7/2015 Cheng ..................... H03L 7/085
(Continued)

*Primary Examiner* — Levi Gannon
(74) *Attorney, Agent, or Firm* — Michael Best & Friedrich LLP

(57) ABSTRACT

Method and apparatus for determining a clock frequency for an electronic processor are provided. One embodiment provides a clock generator for determining a clock frequency for an electronic processor and providing a clock signal to the electronic processor. The clock generator includes a crystal oscillator producing a reference signal and a phase locked loop receiving the reference signal and configured to generate the clock signal based on the reference signal. The clock generator also includes a tuning logic controller electrically coupled to the phase locked loop. The tuning logic controller is configured to program the phase locked loop to a first frequency and determine an integrated circuit process corner of the electronic processor. The tuning logic controller is also configured to determine a second frequency based on the integrated circuit process corner and program the phase locked loop to the second frequency.

13 Claims, 8 Drawing Sheets

(51) Int. Cl.
*H03B 5/12* (2006.01)
*H01R 13/646* (2011.01)

(56) References Cited

U.S. PATENT DOCUMENTS

| | | | |
|---|---|---|---|
| 2002/0190764 A1* | 12/2002 | Nichols | H03L 7/0994 |
| | | | 327/156 |
| 2003/0048863 A1* | 3/2003 | Saeki | G06F 7/68 |
| | | | 375/376 |
| 2007/0120583 A1* | 5/2007 | Lam | H03L 7/0802 |
| | | | 327/156 |
| 2008/0018369 A1* | 1/2008 | Chatterjee | H03L 1/022 |
| | | | 327/157 |
| 2008/0088379 A1* | 4/2008 | Chen | G05F 3/16 |
| | | | 331/57 |
| 2009/0091396 A1* | 4/2009 | Jian | H03L 7/099 |
| | | | 331/16 |
| 2009/0284318 A1* | 11/2009 | Machado | H03L 7/197 |
| | | | 331/16 |
| 2011/0267150 A1* | 11/2011 | Fan | H03L 1/02 |
| | | | 331/36 R |

\* cited by examiner

METHOD AND APPARATUS FOR DETERMINING A CLOCK FREQUENCY FOR AN ELECTRONIC PROCESSOR

BACKGROUND OF THE INVENTION

Synchronous digital systems rely on frequency input received through clock signals to perform their intended functions. In many instances, these digital systems include a clock having a crystal, for example, a quartz crystal that produces periodic vibrations when excited. These vibrations are used by the clock to generate clock signals at various frequencies.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
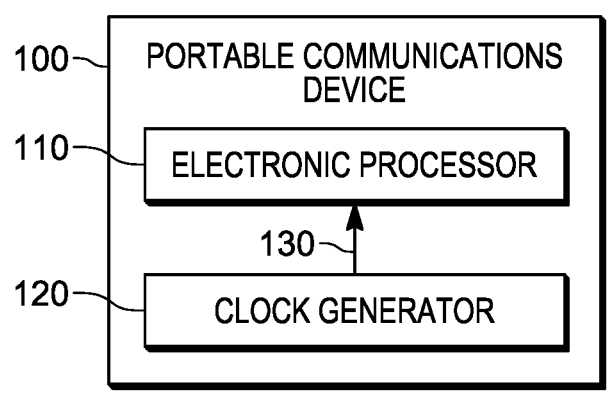
FIG. 1 is a block diagram of a portable communications device in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help improve understanding of embodiments.

The apparatus and method components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

DETAILED DESCRIPTION OF THE INVENTION

Generally, clock signals are produced at a predefined rate that is fixed for the digital system. However, the digital system may be capable of performing different processes at different frequencies. Due to variations in fabrication parameters used in applying an integrated circuit to a semiconductor wafer, the integrated circuit may run slower or faster than specified and at lower or higher temperatures and voltages. Process corners represent the extremes of the fabrication parameter variations within which an integrated circuit must function correctly. The clock frequency at which the integrated circuit operates depends on the process corner of the integrated circuit.

One embodiment provides a method for determining a clock frequency for an electronic processor receiving a clock signal from a clock generator including programming, using a tuning logic controller, a phase locked loop of the clock to a first frequency and determining an integrated circuit process corner of the electronic processor. The method also includes determining a second frequency based on the integrated circuit process corner and programming, using the tuning logic controller, the phase locked loop to the second frequency.

Another embodiment provides a clock generator for determining a clock frequency for an electronic processor and providing a clock signal to the electronic processor. The clock generator includes a crystal oscillator producing a reference signal and a phase locked loop receiving the reference signal and configured to generate the clock signal based on the reference signal. The clock generator also includes a tuning logic controller electrically coupled to the phase locked loop. The tuning logic controller is configured to program the phase locked loop to a first frequency and determine an integrated circuit process corner of the electronic processor. The tuning logic controller is also configured to determine a second frequency based on the integrated circuit process corner and program the phase locked loop to the second frequency.

Another embodiment provides a portable communications device including an electronic processor and a clock generator providing a clock signal to the electronic processor. The clock generator includes a crystal oscillator producing a reference signal and a phase locked loop receiving the reference signal and configured to generate the clock signal based on the reference signal. The clock generator also includes a tuning logic controller electrically coupled to the phase locked loop. The tuning logic controller is configured to program the phase locked loop to a first frequency and determine an integrated circuit process corner of the electronic processor. The tuning logic controller is also configured to determine a second frequency based on the integrated circuit process corner and program the phase locked loop to the second frequency.

FIG. 1 is a block diagram of one embodiment of a portable communications device 100. The portable communications device 100 may be, for example, a portable radio, a mobile radio, a smart telephone, a tablet computer, a laptop computer, or the like. In the example illustrated, the portable communications device 100 includes an electronic processor 110 and a clock generator 120. The electronic processor 110 performs the functions of the portable communications device 100 based on clock signals 130 received from the clock generator 120. The portable communications device 100 may include more or fewer components and may perform additional functions other than those described herein.

Figure 2:
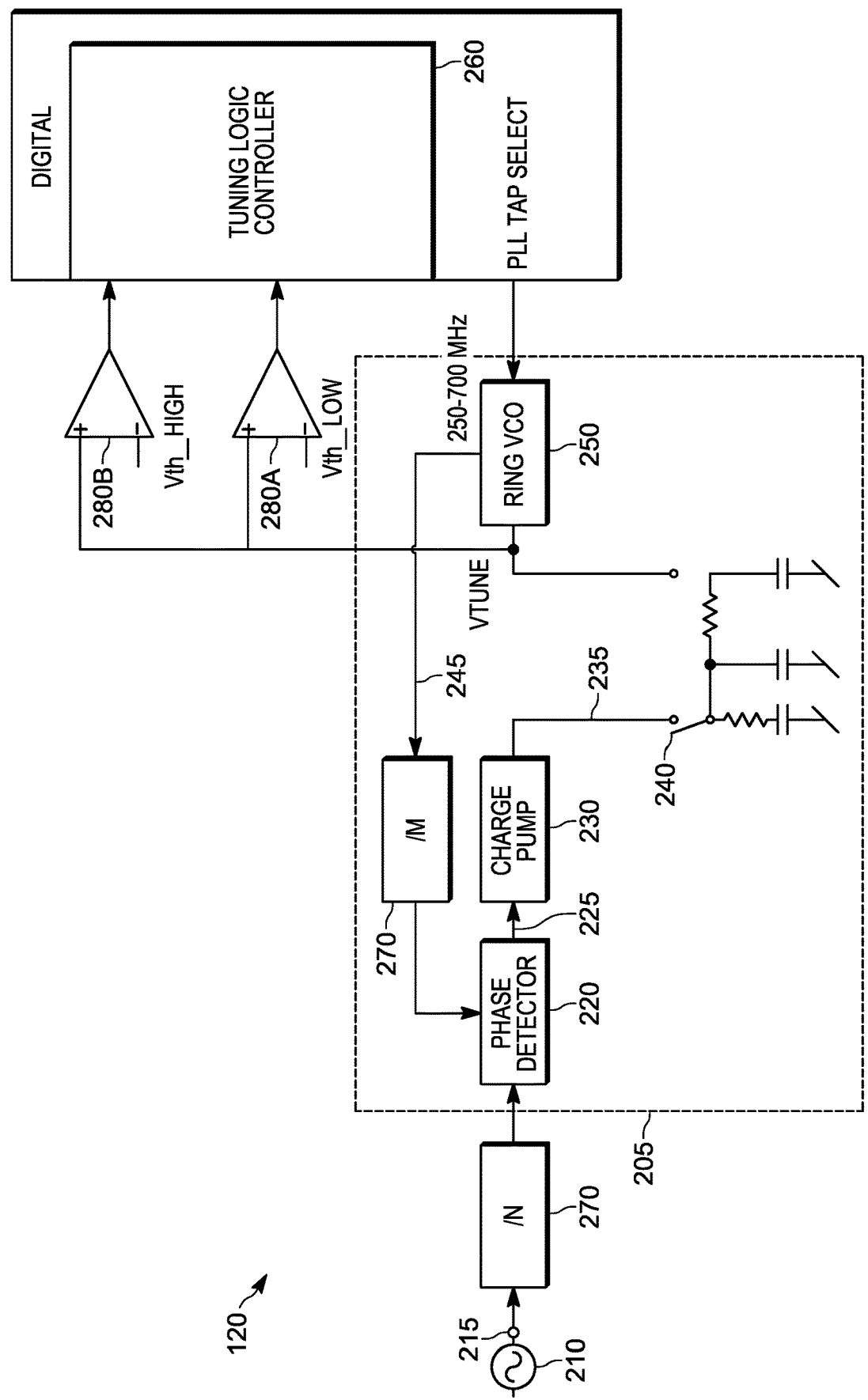
FIG. 2 is a block diagram of a clock generator of the portable communications device of FIG. 1 in accordance with some embodiments.

FIG. 2 is a block diagram of the clock generator 120 according to one exemplary embodiment. In the example illustrated, the clock generator 120 includes a crystal oscillator 210, a phase detector 220, a charge pump 230, a loop filter 240, a voltage controlled oscillator 250, and a tuning logic controller 260. The phase detector 220, the charge pump 230, the loop filter 240, and the voltage controlled oscillator 250 together form a phase locked loop (PLL) 205 that keeps the output clock signals 130 of the clock generator 120 synchronized with a reference signal 215 of the crystal oscillator 210. The clock generator 120 may include more of fewer components and may perform additional functions other than those described.

The crystal oscillator 210 includes a crystal, for example, a quartz crystal that is excited by a voltage source (not shown). The crystal produces oscillations with a near-constant frequency when excited by the voltage source. The oscillations produced by the crystal are output as the reference signal 215 of the crystal oscillator 210 and provided to the phase detector 220.

The phase detector 220 receives a feedback signal 245 from the voltage controlled oscillator 250, which represents a clock signal 130 output by the clock generator 120, in addition to the reference signal 215 from the crystal oscillator 210. The phase detector 220 detects a phase difference between the feedback signal 245 and the reference signal 215. The phase detector 220 provides a control signal 225 to the charge pump 230 to control the charge pump 230 based on the phase difference between the feedback signal 245 and the reference signal 215. In some embodiments, the clock generator 120 may be configured to produce clock signal 130 of multiple frequencies from a single reference signal 215. For example, the clock signal 130 may have a frequency that is a multiple of the reference signal 215. In these embodiments, dividers 270 may be used between the crystal oscillator 210 and the phase detector 220 and/or between the voltage controlled oscillator 250 and the phase detector 220 such that the phase detector 220 receives two signals of the same frequency.

The charge pump 230 outputs a tuning voltage 235 (that is, a tuning voltage for the voltage controlled oscillator 250) proportional to the phase difference detected by the phase detector 220. The tuning voltage 235 controls the voltage controlled oscillator 250 to adjust an output clock signal 130, and thereby the feedback signal 245, such that the output clock signal 130 is in phase with the reference signal 215. The tuning voltage 235 is filtered through the loop filter 240 before being provided to the voltage controlled oscillator 250. The loop filter 240 may be provided on the same chip as the phase locked loop 205 or may be provided off the chip. The loop filter 240 may limit or reduce noise on the tuning voltage 235, such as, a ripple generated by the phase detector 220.

The voltage controlled oscillator 250 adjusts the phase and or frequency of the clock signal 130 based on the tuning voltage 235 from the charge pump 230. Accordingly, the phase locked loop 205 achieves an output clock signal 130 that is synchronized with the reference signal 215 from the crystal oscillator 210.

The tuning logic controller 260 selects an output frequency of the voltage controlled oscillator 250 based on the requirements of, for example, the electronic processor 110. The tuning voltage 235 is provided to the comparators 280 (for example, a low comparator 280A and a high comparator 280B). The tuning logic controller 260 may be configured to adjust a threshold value of the comparators 280. The comparators 280 output a signal to the tuning logic controller 260 indicating whether the tuning voltage 235 exceeds the respective thresholds of the comparators 280.

Figure 3:
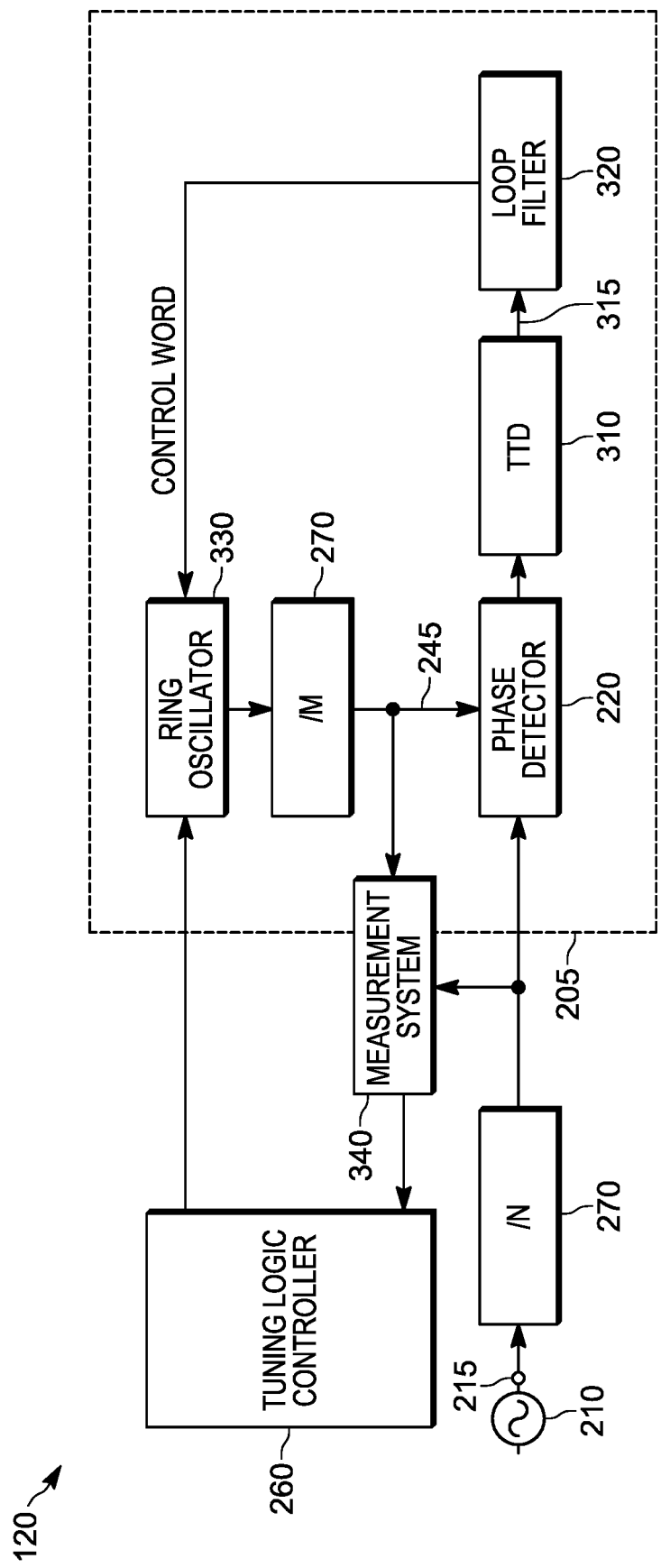
FIG. 3 is a block diagram of a clock generator of the portable communications device of FIG. 1 in accordance with some embodiments.

FIG. 3 is a block diagram of another embodiment of the clock generator 120 according to another exemplary embodiment. In the example illustrated, the clock generator 120 includes the crystal oscillator 210, the phase detector 220, a time-to-digital converter 310, a digital loop filter 320, a digitally controlled oscillator 330 and a measurement system 340. The phase detector 220, the time-to-digital converter 310, the digital loop filter 320, and the digitally controlled oscillator 330 together form the phase locked loop 205 of the clock generator 120. The clock generator 120 may include more of fewer components and may perform additional functions other than those described herein.

The time-to-digital converter 310 converts the control signal 225 from the phase detector 220 to a control word 315 (for example, an instantaneous value). Similar to the tuning voltage 235, the control word 315 controls the digitally controlled oscillator 330 to adjust an output clock signal 130, and thereby the feedback signal 245, such that the output clock signal 130 is in phase with the reference signal 215. The control word 315 is filtered through the digital loop filter 320 before being provided to the digitally controlled oscillator 330. The digital loop filter 320 is provided on the same chip as the phase locked loop 205. The digital loop filter 320 filters the instantaneous values generated by the time-to-digital converter's 310 measurement of the phase detector's 220 pulse output to present a frequency constrained control work to the digitally controlled oscillator 330.

The digitally controlled oscillator 330 is an oscillator that uses digital inputs to switch circuits internal to the oscillator to control the oscillating frequency of the phase locked loop 205. The internal switch circuits may control a number of devices within the digitally controlled oscillator 330 as well as drive strengths of stages of the digitally controlled oscillator 330. Accordingly, the phase locked loop 205 achieves an output clock signal 130 that is synchronized with the reference signal 215 from the crystal oscillator 210.

The reference signal 215 and the feedback signal 245 are also provided to the measurement system 340. The measurement system 340 measure cycles in the reference signal 215 and the feedback signal 245 and provides the measurement results to a controller (not shown) that sets the dividers 270 and the control work of the digitally controlled oscillator 330 to measure the integrated circuit process corner (for example, integrated circuit manufacturing process parameters).

FIG. 2 shows an analog implementation of the phase locked loop 205, whereas FIG. 3 shows a digital implementation of the phase locked loop 205 (that is, DPLL). Accordingly, the clock generator 120 may be implemented using the analog phase locked loop 205 as shown in FIG. 2 or using the digital phase locked loop 205 as shown in FIG. 3 based on the requirements of the system.

Figure 4:
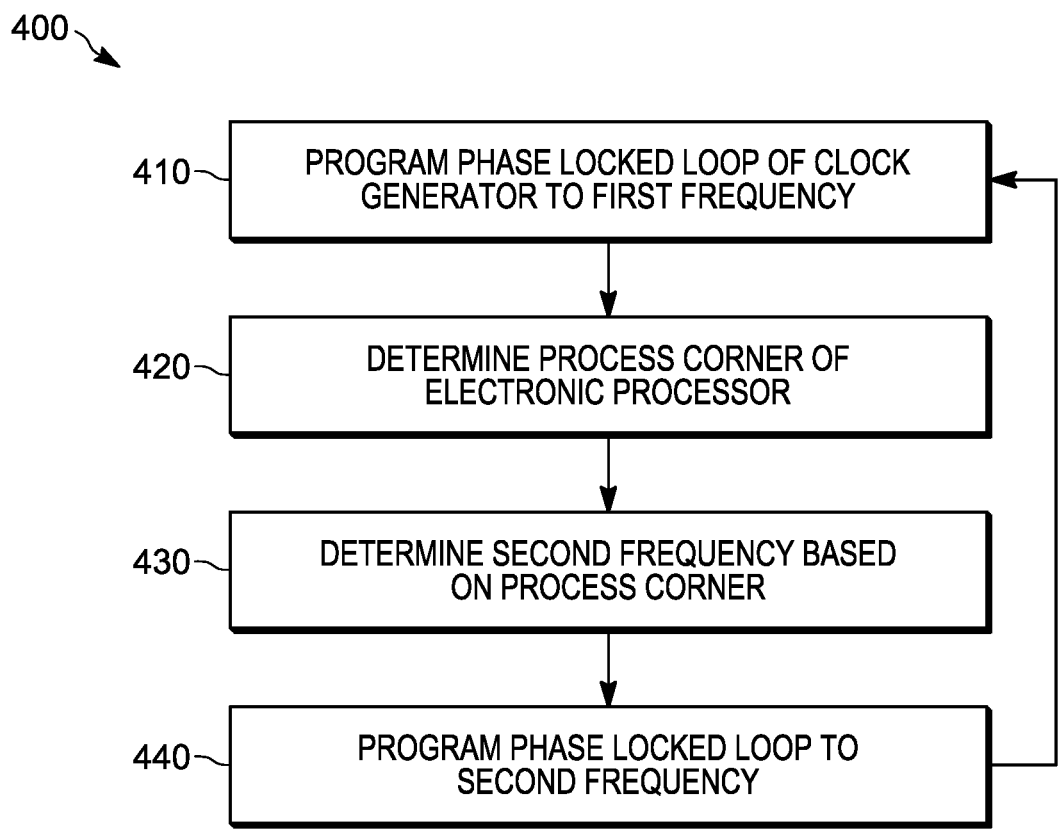
FIG. 4 is a flowchart of a method for determining a clock frequency for an electronic processor of the portable communications device of FIG. 1 in accordance with some embodiments.

FIG. 4 is a flowchart illustrating one example method 400 for determining a clock frequency of the electronic processor 110. As illustrated in FIG. 4, the method 400 includes programming, using the tuning logic controller 260, the phase locked loop 205 of the clock generator 120 to a first frequency (at block 410). The clock generator 120 may be programmed to an initial frequency, for example, a default starting frequency. The tuning logic controller 260 provides a selection signal to the voltage controlled oscillator 250 or the digitally controlled oscillator 330 to select an output frequency of the clock generator 120.

Figure 5:
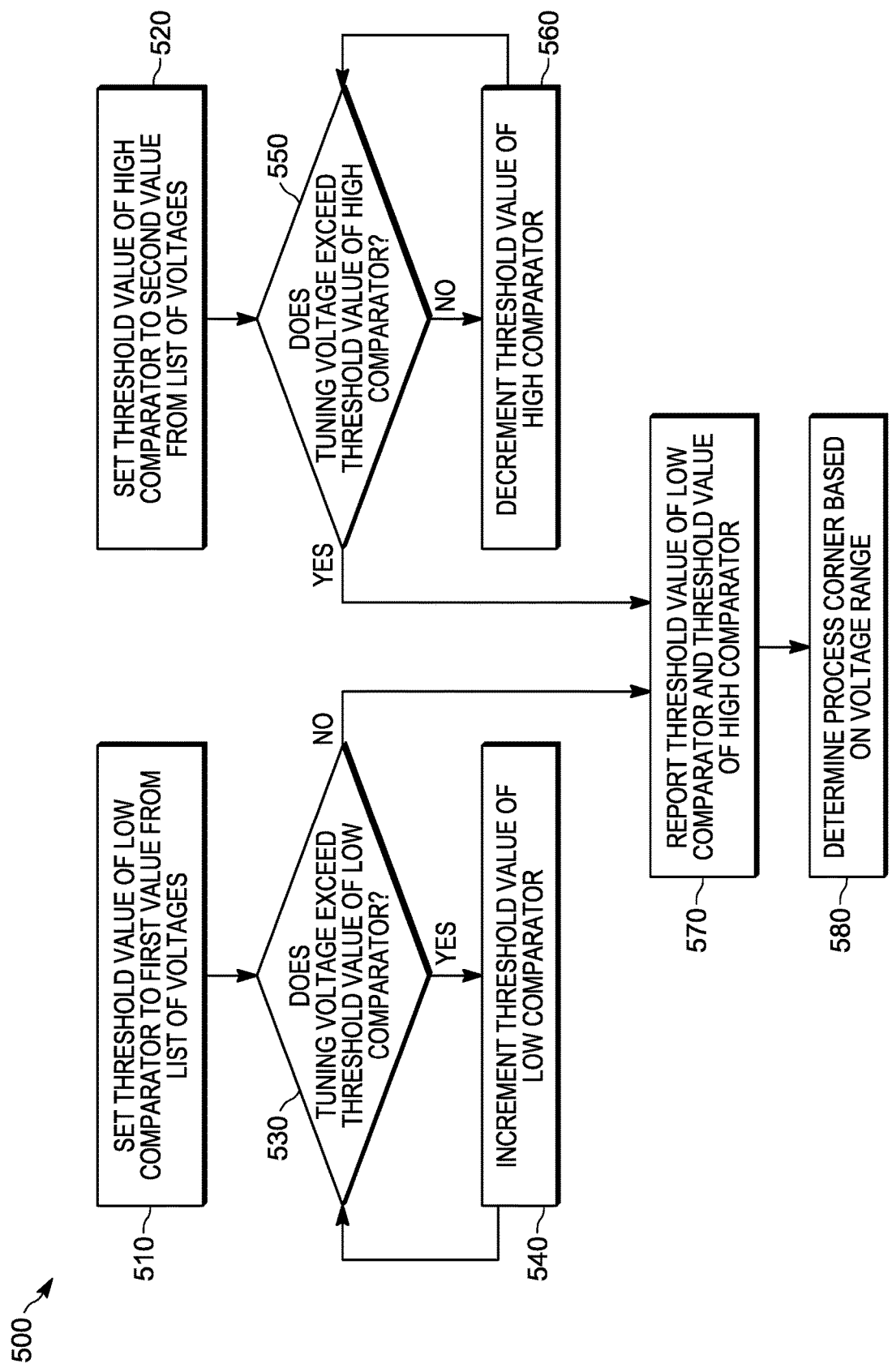
FIG. 5 is a flowchart of a method for determining an integrated circuit process corner of the electronic processor of the portable communications device of FIG. 1 in accordance with some embodiments.
Figure 6:
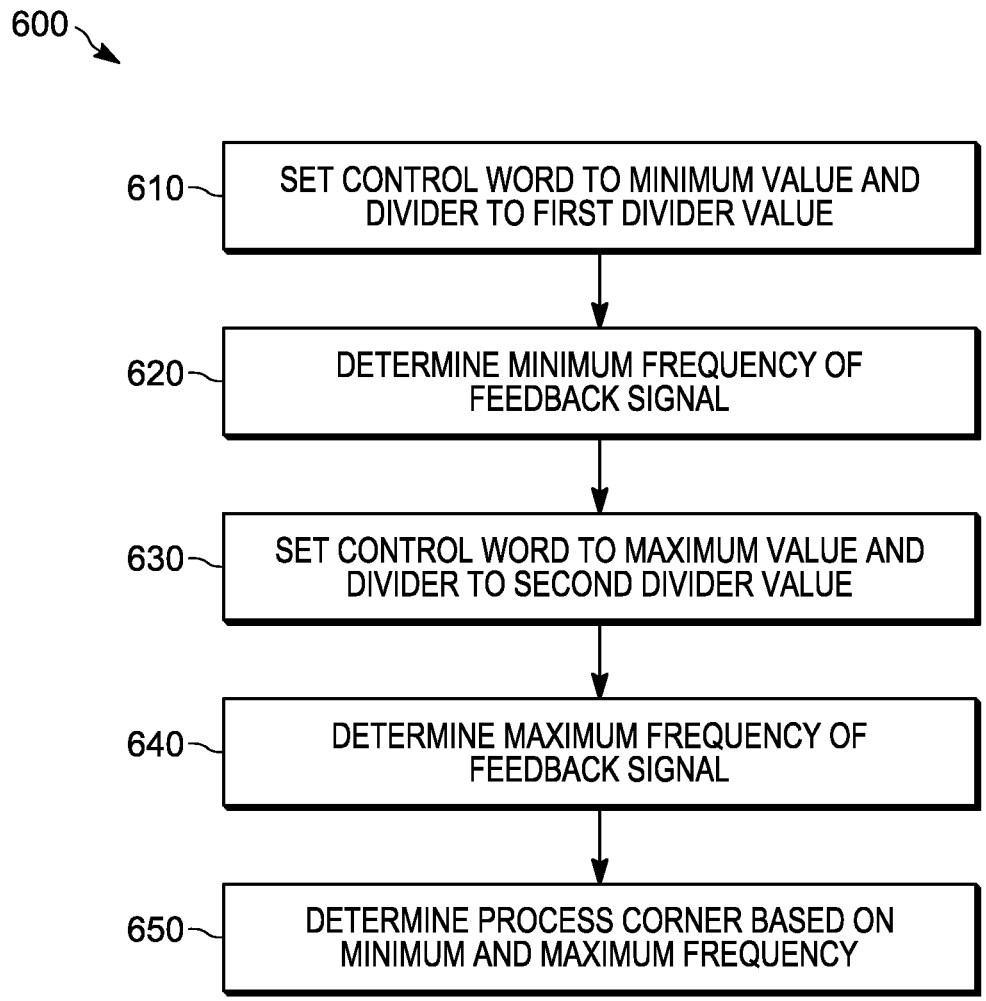
FIG. 6 is a flowchart of a method for determining an integrated circuit process corner of the electronic processor of the portable communications device of FIG. 1 in accordance with some embodiments.

The method 400 also includes determining an integrated circuit (IC) process corner of the electronic processor 110 connected to the clock generator 120 (at block 420). The integrated circuit process corner is a speed at which the electronic processor 110 or an integrated circuit runs a process. For example, the integrated circuit process corner may be a typical process, where the electronic processor 110 runs the process at a typical or normal speed (normal clock frequency), a fast process, where the electronic processor 110 runs the process at a faster than normal speed, and a slow process, where the electronic processor 110 runs the process at a slower than normal speed. The tuning logic controller 260 may determine the integrated circuit process corner by determining the tuning voltage of the voltage controlled oscillator 250 or by measuring the cycles in the reference signal 215 and the feedback signal 245. FIG. 5 shows a method 500 of determining the integrated circuit process corner by measuring the tuning voltage of the analog phase locked loop 205 of FIG. 2, whereas FIG. 6 shows a method 600 of determining an integrated circuit process corner by measuring cycles in the reference signal 215 and feedback signal 245 based on the digital phase locked loop 205 of FIG. 3.

The method 400 further includes determining a second frequency based on the integrated circuit process corner (at block 430). Once the tuning logic controller 260 determines the integrated circuit process corner of the electronic processor 110, the tuning logic controller 260 determines an appropriate frequency (that is, the second frequency) for the particular process. The tuning logic controller 260 may determine the second frequency, for example, based on a mapping stored in a memory or a register of the tuning logic controller 260. The second frequency may be determined based on both the determined integrated circuit process corner and a measured ambient temperature.

The method 400 also includes programming, using the tuning logic controller 260, the phase locked loop 205 to the second frequency (at block 440). The tuning logic controller 260 provides a selection signal to the voltage controlled oscillator 250 or the digitally controlled oscillator 330 to select the second frequency as the output frequency of the clock generator 120. The method 400 continues to determine the integrated circuit process corner for the next process or thread of the electronic processor 110.

FIG. 5 is a flowchart illustrating on example method 500 of determining an integrated circuit process corner of the electronic processor 110 using the analog phase locked loop 205 of FIG. 2. The method 500 is based on determining a tuning voltage of the phase locked loop 205. Tuning voltages for typical, fast and slow processes may be known from phase locked loop 205 simulations. That is, the phase locked loop 205 has a tuning voltage associated with a programmed frequency of the phase locked loop 205. Therefore, the method 500 determines the tuning voltage to determine the integrated circuit process corner of the electronic processor 110.

In the example illustrated, the method 500 includes setting a threshold value of the low comparator 280A to a first value from a list of voltages (at block 510) and setting a threshold value of the high comparator 280B to a second value from the list of voltages (at block 520). The tuning logic controller 260 provides a control signal to the low comparator 280A and the high comparator 280B to set the low voltage threshold (that is, the threshold value of the low comparator 280A) and the high voltage threshold (that is, the threshold value of the high comparator 280B). Alternatively, the tuning logic controller 260 may adjust the reference signals provided to the comparators 280 to set the low voltage threshold and the high voltage threshold. The voltages used for the low voltage threshold and the high voltage threshold may be stored as a list in a memory or register of the tuning logic controller 260. The list of voltages may include a lowest voltage, a highest voltage, and a plurality of voltage between the lowest voltage and the highest voltage based on a step size. The step size may be based on the precision of the phase locked loop 205. In one example, the step size may be 100 milli-Volts (mV). Initially the first value and the second value may be the lowest voltage and the highest voltage respectively.

The method 500 further includes determining whether tuning voltage exceeds the threshold value of the low comparator 280A (at block 530). The low comparator 280A receives the tuning voltage (that is, the tuning voltage 235) from the charge pump 230 after passing through the loop filter 240. The low comparator 280A provides a signal indicating whether the tuning voltage exceeds the low voltage threshold to the tuning logic controller 260.

The method 500 further includes incrementing the threshold value of the low comparator 280A (that is, the low voltage threshold) higher when the tuning voltage exceeds the threshold value of the low comparator 280A (at block 560). The tuning logic controller 260 increments the low voltage threshold to the next voltage value in the list of voltages. As described above, the tuning logic controller 260 may provide a control signal or may adjust the voltage reference signal to increment the low voltage threshold of the low comparator 280A. The tuning logic controller 260 increments the low voltage threshold until the tuning voltage does not exceed the low voltage threshold. Accordingly, the tuning logic controller 260 adjusts the low voltage threshold higher to a first voltage, where the first voltage is the voltage at which the tuning voltage does not exceed the low voltage threshold.

The method 500 also includes determining whether the tuning voltage exceeds the threshold value of the high comparator 280B (at block 550). Similar to the low comparator 280A, the high comparator 280B receives the tuning voltage (that is, the tuning voltage 235) from the charge pump 230 after passing through the loop filter 240. The high comparator 280B provides a signal indicating whether the tuning voltage exceeds the high voltage threshold to the tuning logic controller 260.

The method 500 also includes decrementing the threshold value of the high comparator 280B (که، the high voltage threshold) lower when the tuning voltage does not exceed the threshold value of the high comparator 280B (at block 560). The tuning logic controller 260 decrements the high voltage threshold to the next voltage value in the list of voltages. As described above, the tuning logic controller 260 may provide a control signal or may adjust the voltage reference signal to decrement the high voltage threshold of the high comparator 280B. The tuning logic controller 260 decrements the high voltage threshold until the tuning voltage exceeds the high voltage threshold. Accordingly, the tuning logic controller 260 adjusts the high voltage threshold lower to a second voltage, where the second voltage is the voltage at which the tuning voltage exceeds the high voltage threshold.

The method 500 further includes reporting the threshold value of low comparator 280A when the tuning voltage does not exceed the threshold value of the low comparator 280A and reporting the threshold value of the high comparator 280B when the tuning voltage exceeds the threshold value of the high comparator 280B (at block 570). Accordingly, the low voltage threshold (that is, first voltage) and the high voltage threshold (that is, second voltage) are recorded by the tuning logic controller 260. The first voltage and the second voltage define a voltage range of the tuning voltage for the first frequency. The first voltage provides an upper bound of the voltage range and the second voltage provides a lower bound of the voltage range.

The method 500 further includes determining the integrated circuit process corner of the electronic processor 110 and the corresponding frequency (that is, the second frequency) based on the voltage range (at block 580). The tuning logic controller 260 may store a mapping between the voltage range and the integrated circuit process corner in a memory or register of the tuning logic controller 260. The tuning logic controller 260 determines the integrated circuit process corner based on the mapping between the voltage range and the integrated circuit process corner.

In some embodiments, the clock generator 120 may include an on-chip or off-chip temperature sensor to detect an ambient temperature. The temperature reading may be used to remove temperature effects on determining the integrated circuit process corner. For example, the mapping may further be between a temperature range, the voltage range and the integrated circuit process corner. In these embodiments, the tuning logic controller 260 determines the integrated circuit process corner and/or the second frequency based on the voltage range and the ambient temperature.

FIG. 6 is a flowchart illustrating one example method 600 of determining an integrated circuit process corner of the electronic processor 110 using the digital phase locked loop 205 of FIG. 3. The method 600 is based on determining the maximum and minimum frequencies of the output clock signal 130. Deviation between minimum and maximum frequencies for typical, fast, and slow processes may be known from phase locked loop 205 simulations. Therefore, the method 600 determines the approximate minimum and maximum frequencies of the feedback signal 245 to determine the integrated circuit process corner of the electronic processor 110.

In the example illustrated, the method 600 includes setting the control word 315 to a minimum value and setting the multiplier or divider 270 to a first divider value (at block 610). The tuning logic controller 260 controls the time-to-digital converter 310 to output the minimum value as the control word 315 to the digitally controlled oscillator 330. The tuning logic controller 260 also sets the dividers 270 to the appropriate value such that the reference signal 215 and the feedback signal 245 are approximately at the same frequency. That is, the first divider value corresponds to a first difference in frequency between the reference signal 215 and the feedback signal 245 when the control word 315 is set to the minimum value.

The method 600 also includes determining a minimum frequency (Fmin) of the feedback signal 245 (at block 620). The measurement system 340 counts the number of cycles in the reference signal 215 and the feedback signal 245 for a sufficient period of time to determine an approximate minimum frequency of the feedback signal 245 based on the minimum control word 315.

The method 600 further includes setting the control word 315 to a maximum value and setting the multiplier or divider 270 to a second divider value (at block 630). The tuning logic controller 260 controls the time-to-digital converter 310 to output the maximum value as the control word 315 to the digitally controlled oscillator 330. The tuning logic controller 260 also sets the multipliers or dividers 270 to the appropriate value such that the reference signal 215 and the feedback signal 245 are approximately at the same frequency. That is, the second divider value corresponds to a second difference in frequency between the reference signal 215 and the feedback signal 245 when the control word 315 is set to the maximum value.

The method 600 also includes counting cycles of the reference signal 215 and the feedback signal 245 to determine a maximum frequency (Fmax) of the feedback signal 245 (at block 640). The measurement system 340 counts the number of cycles in the reference signal 215 (for example, first plurality of cycles) and the feedback signal 245 (for example, second plurality of cycles) for a sufficient period of time (for example, predetermined period of time) to determine an approximate maximum frequency of the feedback signal 245 based on the maximum control word 315.

The method 600 further includes determining the integrated circuit process corner of the electronic processor 110 based on the minimum frequency and the maximum frequency (at block 650). The tuning logic controller 260 may store a mapping between a frequency range (that is, the range between the approximate minimum frequency and the approximate maximum frequency of the feedback signal 245) and the integrated circuit process corner in a memory or register of the tuning logic controller 260. The tuning logic controller 260 determines the integrated circuit process corner based on the mapping between the frequency range and the integrated circuit process corner.

In some embodiments, the clock generator 120 may include an on-chip or off-chip temperature sensor to detect an ambient temperature. The temperature reading may be used to remove temperature effects on determining the integrated circuit process corner. For example, the mapping may further be between a temperature range, the frequency range and the integrated circuit process corner. In these embodiments, the tuning logic controller 260 determines the integrated circuit process corner and/or the second frequency based on the frequency range and the ambient temperature.

In some embodiments, the phase locked loop 205 of FIG. 2 may be modified to include the measurement system 340. Rather than determining the tuning voltage, method 500 may be modified similar to method 600 to determine the integrated circuit process corner based on the approximate minimum and maximum frequency of the feedback signal 245. In these embodiments, rather than adjusting the threshold values of the comparators 280, the charge pump 230 may be controlled to output a maximum and minimum tuning voltage 235 in order to measure the minimum and maximum frequency of the feedback signal 245.

In some embodiments, the phase locked loop 205 may be modified to include an additional voltage controlled oscillator or an additional digitally controlled oscillator dedicated for integrated circuit process corner determinations.

Figure 7A:
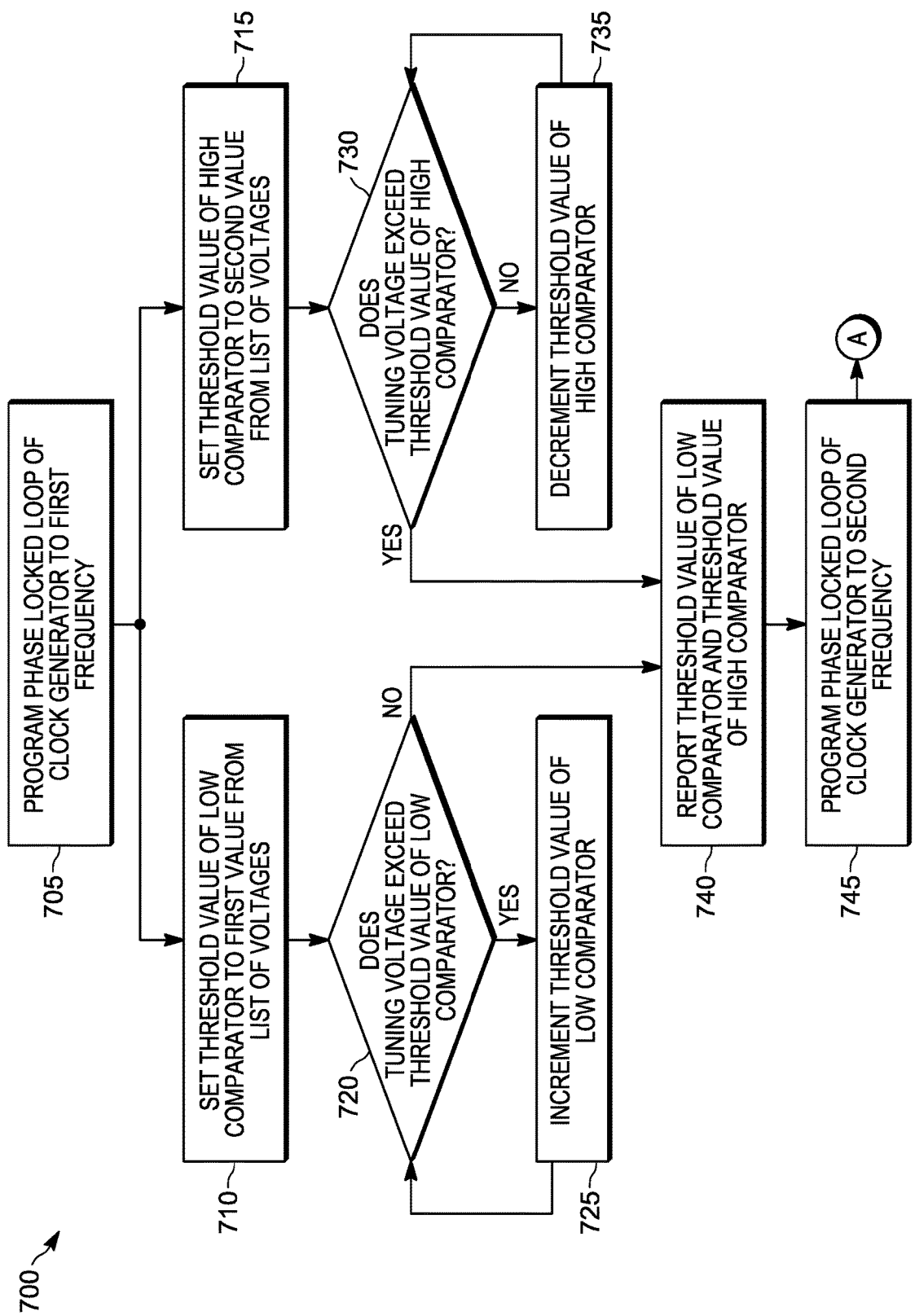
FIGS. 7A-B illustrate a flowchart of a method for determining a gain of a voltage controlled oscillator in accordance with some embodiments.
Figure 7B:
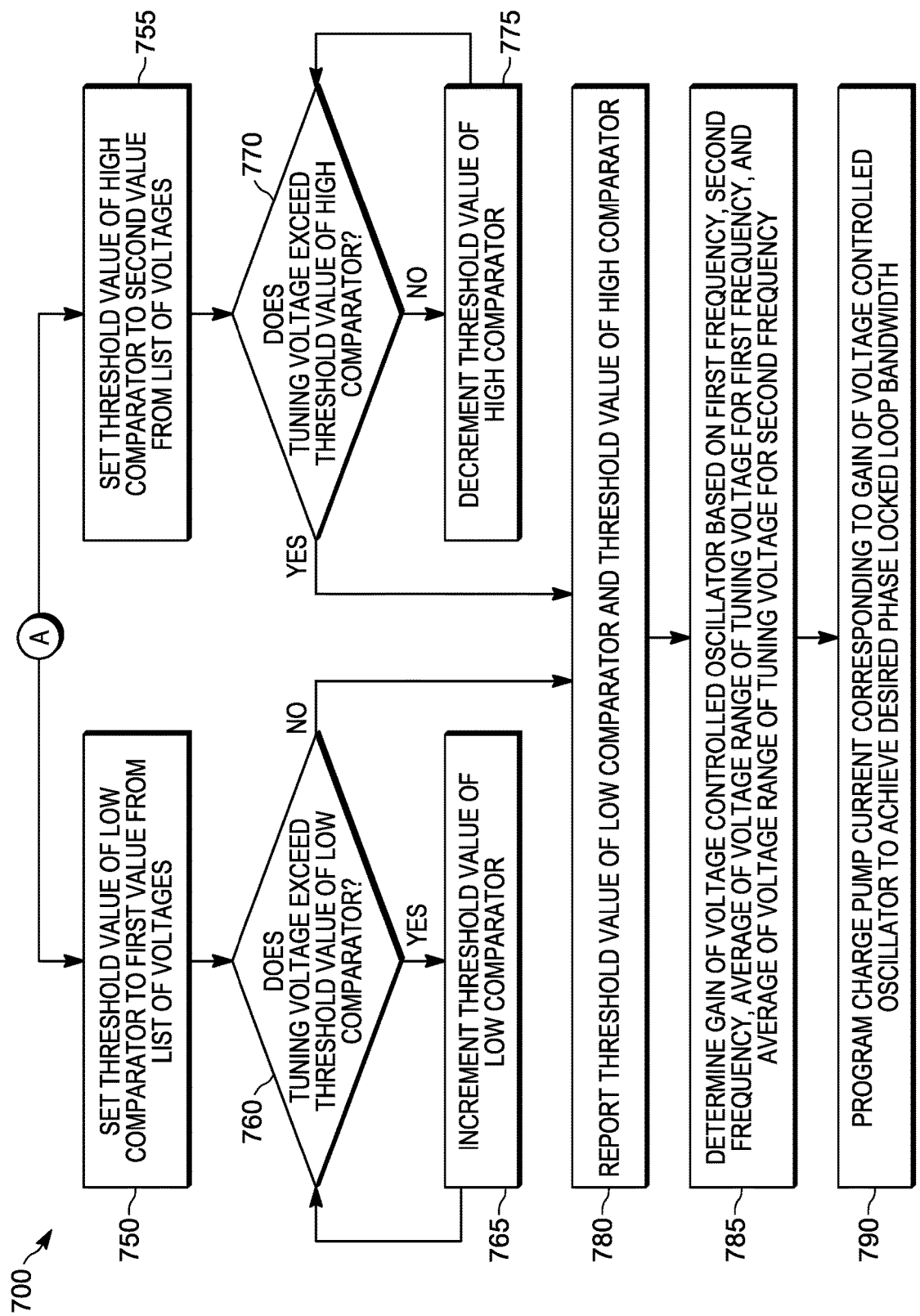

FIG. 7 is a flowchart illustrating one example method 700 of determining a gain of the voltage controlled oscillator 250. The method 700 determines the gain after programming the phase locked loop 205 to the second frequency as described with respect to method 400. The method 700 may operate similar to the method 500 to determine the voltage range of the tuning voltage for the first frequency as illustrated in FIG. 7A. The method 700 is described with respect to the clock generator 120 as illustrated in FIG. 2.

In the example illustrated, the method 700 includes programming the phase locked loop 205 of the clock generator 120 to a first frequency (at block 705). As described above, the tuning logic controller 260 provides a selection signal to the voltage controlled oscillator 250 to select an output frequency of the clock generator 120. The method 700 also includes, similar to method 500, setting the threshold value of the low comparator 280A to first value from the list of voltages (at block 710) and setting the threshold value of the high comparator 280B to the second value from the list of voltages (at block 715).

The method 700 further includes determining whether tuning voltage exceeds the threshold value of the low comparator 280A (at block 720) and incrementing the threshold value of the low comparator 280A (for example, low voltage threshold) higher when the tuning voltage exceeds the threshold value of the low comparator 280A (at block 725). The tuning logic controller 260 increments the low voltage threshold until the tuning voltage does not exceed the low voltage threshold. Accordingly, the tuning logic controller 260 adjusts the low voltage threshold higher to a first voltage, where the first voltage is the voltage at which the tuning voltage does not exceed the low voltage threshold.

The method 700 also includes determining whether the tuning voltage exceeds the threshold value of the high comparator 280B (at block 730) and decrementing the threshold value of the high comparator 280B (for example, high voltage threshold) lower when the tuning voltage does not exceed the threshold value of the high comparator 280B (at block 735). The tuning logic controller 260 decrements the high voltage threshold until the tuning voltage exceeds the high voltage threshold. Accordingly, the tuning logic controller 260 adjusts the high voltage threshold lower to a second voltage, where the second voltage is the voltage at which the tuning voltage exceeds the high voltage threshold.

The method 700 further includes reporting the threshold value of low comparator 280A when the tuning voltage does not exceed the threshold value of the low comparator 280A and reporting the threshold value of the high comparator 280B when the tuning voltage exceeds the threshold value of the high comparator 280B (at block 740). Accordingly, the method 700 determines the voltage range of the tuning voltage for the first frequency signal. The method 700 proceeds to programming the phase locked loop 205 of the clock generator 120 to a second frequency (at block 745). As described above, the tuning logic controller 260 provides a selection signal to the voltage controlled oscillator 250 to select an output frequency of the clock generator 120.

The method continues as illustrated in FIG. 7 and determines a voltage range of the tuning voltage for the second frequency. The method 700 includes setting the threshold value of the low comparator 280A to first value from the list of voltages (at block 750) and setting the threshold value of the high comparator 280B to the second value from the list of voltages (at block 755).

The method 700 also includes determining whether tuning voltage exceeds the threshold value of the low comparator 280A (at block 760) and incrementing the threshold value of the low comparator 280A (for example, second low voltage threshold) higher when the tuning voltage exceeds the threshold value of the low comparator 280A (at block 765). The tuning logic controller 260 increments the low voltage threshold until the tuning voltage does not exceed the low voltage threshold. Accordingly, the tuning logic controller 260 adjusts the low voltage threshold higher to a third voltage, where the third voltage is the voltage at which the tuning voltage does not exceed the low voltage threshold.

The method 700 further includes determining whether the tuning voltage exceeds the threshold value of the high comparator 280B (at block 770) and decrementing the threshold value of the high comparator 280B (for example, second high voltage threshold) lower when the tuning voltage does not exceed the threshold value of the high comparator 280B (at block 775). The tuning logic controller 260 decrements the high voltage threshold until the tuning voltage exceeds the high voltage threshold. Accordingly, the tuning logic controller 260 adjusts the high voltage threshold lower to a fourth voltage, where the fourth voltage is the voltage at which the tuning voltage exceeds the high voltage threshold.

The method 700 also includes reporting the threshold value of low comparator 280A when the tuning voltage does not exceed the threshold value of the low comparator 280A and reporting the threshold value of the high comparator 280B when the tuning voltage exceeds the threshold value of the high comparator 280B (at block 780). Accordingly, the method 700 determines the voltage range of the tuning voltage for the second frequency signal.

The method 700 further includes determining the gain of the voltage controlled oscillator 250 based on the first frequency, the second frequency, an average of the voltage range of the tuning voltage for the first frequency, and an average of the voltage range of the tuning voltage for the second frequency (at block 785). The tuning voltage controller 260 determines the average of the voltage range of the tuning voltage for the first frequency and the average of the voltage range of the tuning voltage for the second frequency. The tuning logic controller 260 also determines the difference between the first frequency and the second frequency and the difference between the average of the voltage range of the tuning voltage for the first frequency and the average of the voltage range of the tuning voltage for the second frequency. The tuning voltage controller 260 determines the gain (Kvco) by dividing the difference between the first frequency and the second frequency with the difference between the average of the voltage range of the tuning voltage for the first frequency and the average of the voltage range of the tuning voltage for the second frequency.

The method 700 also includes programming charge pump current of the charge pump 230 corresponding to the gain of the voltage controlled oscillator 250 to achieve desired phase locked loop bandwidth (at block 790). Once the gain of the voltage controlled oscillator 250 is determined, the tuning logic controller 260 programs charge pump current of the charge pump 230 to achieve desired phase locked loop 205 bandwidth and, therefore, achieve minimum phase locked loop 205 jitter.

Although the methods 400, 500, 600, 700 are described with respect to electronic processor 110, the methods 400, 500, 600, 700 may be used to determine processor corner and jitter of any integrated circuit connected to the clock generator 120 and receiving the clock signal 130.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method for determining a clock frequency for an electronic processor receiving a clock signal from a clock generator, the method comprising:
   programming, using a tuning logic controller, a phase locked loop of the clock generator to a first frequency, the phase locked loop having a tuning voltage associated with the first frequency;
   determining a voltage range of the tuning voltage for the first frequency;
   determining an integrated circuit process corner of the electronic processor based on the voltage range;
   determining a second frequency based on the integrated circuit process corner; and
   programming, using the tuning logic controller, the phase locked loop to the second frequency.

2. The method of claim 1, further comprising:
   determining, using a temperature sensor, an ambient temperature, wherein determining the integrated circuit process corner is based on the ambient temperature.

3. The method of claim 1 wherein determining the voltage range of the tuning voltage further comprises:
   setting a low voltage threshold to a first value from a list of voltages;
   setting a high voltage threshold to a second value from the list of voltages;
   adjusting the low voltage threshold higher to a first voltage based on the tuning voltage;
   adjusting the high voltage threshold lower to a second voltage based on the tuning voltage, the first voltage and the second voltage defining the voltage range of the tuning voltage for the first frequency.

4. The method of claim 3, wherein the phase locked loop includes a phase detector receiving a reference signal, a charge pump coupled to the phase detector and configured to output the tuning voltage, and a voltage controlled oscillator receiving the tuning voltage and configured to generate the clock signal based on the tuning voltage, the method further comprising:
   setting a second low voltage threshold to the first value from the list of voltages;
   setting a second high voltage threshold to the second value from the list of voltages;
   adjusting the second low voltage threshold higher to a third voltage based on the tuning voltage;
   adjusting the second high voltage threshold lower to a fourth voltage based on the tuning voltage, the third voltage and the fourth voltage defining a voltage range of the tuning voltage for the second frequency;
   determining a gain of the voltage controlled oscillator based on the first frequency, the second frequency, an average of the voltage range of the tuning voltage for the first frequency, and an average of the voltage range of the second frequency; and programming a charge pump current corresponding to the gain of the voltage controlled oscillator to achieve desired phase locked loop bandwidth.

5. A clock generator for determining a clock frequency for an electronic processor and providing a clock signal to the electronic processor, the clock generator comprising:
a crystal oscillator producing a reference signal;
a phase locked loop receiving the reference signal and configured to generate the clock signal based on the reference signal; and
a tuning logic controller electrically coupled to the phase locked loop, the tuning logic controller configured to:
program the phase locked loop to a first frequency, the phase locked loop having a tuning voltage associated with the first frequency,
determine a voltage range of the tuning voltage for the first frequency,
determine an integrated circuit process corner of the electronic processor connected to the clock generator based on the voltage range,
determine a second frequency based on the integrated circuit process corner; and
program the phase locked loop to the second frequency.

6. The clock generator of claim 5, further comprising:
a temperature sensor detecting a an ambient temperature, wherein the tuning logic controller is further configured to determine the integrated circuit process corner based on the ambient temperature.

7. The clock generator of claim 5, wherein the phase locked loop includes:
a phase detector receiving the reference signal;
a charge pump coupled to the phase detector and configured to output the tuning voltage; and
a voltage controlled oscillator receiving the tuning voltage and configured to generate the clock signal based on the tuning voltage.

8. The clock generator of claim 7, further comprising:
a low comparator electrically coupled to the tuning logic controller and receiving the tuning voltage, the low comparator having a low voltage threshold; and
a high comparator electrically coupled to the tuning logic controller and receiving the tuning voltage, the high comparator having a high voltage threshold;
wherein the tuning logic controller for determining the voltage range of the tuning voltage is further configured to:
set the low voltage threshold to a first value from a list of voltages;
set the high voltage threshold to a second value from the list of voltages;
adjust the low voltage threshold higher to a first voltage based on the tuning voltage;
adjust the high voltage threshold lower to a second voltage based on the tuning voltage, the first voltage and the second voltage defining the voltage range of the tuning voltage for the first frequency.

9. The clock generator of claim 8, wherein after programming the phase locked loop to the second frequency, the tuning logic controller is further configured to:
set the low voltage threshold to the first value from the list of voltages;
set the high voltage threshold to the second value from the list of voltages;
adjust the low voltage threshold higher to a third voltage based on the tuning voltage;
adjust the high voltage threshold lower to a fourth voltage based on the tuning voltage, the third voltage and the fourth voltage defining a voltage range of the tuning voltage for the second frequency;
determine a gain of the voltage controlled oscillator based on the first frequency, the second frequency, an average of the voltage range of the tuning voltage for the first frequency, and an average of the voltage range of the tuning voltage for the second frequency; and
program a charge pump current of the charge pump corresponding to the gain of the voltage controlled oscillator to achieve desired phase locked loop bandwidth.

10. A portable communications device, comprising:
an electronic processor;
a clock generator providing a clock signal to the electronic processor, the clock generator including:
a crystal oscillator producing a reference signal;
a phase locked loop receiving the reference signal and configured to generate the clock signal based on the reference signal; and
a tuning logic controller electrically coupled to the phase locked loop, the tuning logic controller configured to:
program the phase locked loop to a first frequency, the phase locked loop having a tuning voltage associated with the first frequency,
determine a voltage range of the tuning voltage for the first frequency,
determine an integrated circuit process corner of the electronic processor based on the voltage range,
determine a second frequency based on the integrated circuit process corner; and
program the phase locked loop to the second frequency.

11. The portable communications device of claim 10, further comprising:
a temperature sensor detecting a an ambient temperature, wherein the tuning logic controller is further configured to determine the integrated circuit process corner based on the ambient temperature.

12. The portable communications device of claim 10, wherein the phase locked loop includes:
a phase detector receiving the reference signal;
a charge pump coupled to the phase detector and configured to output the tuning voltage;
a voltage controlled oscillator receiving the tuning voltage and configured to generate the clock signal based on the tuning voltage;
a low comparator electrically coupled to the tuning logic controller and receiving the tuning voltage, the low comparator having a low voltage threshold; and
a high comparator electrically coupled to the tuning logic controller and receiving the tuning voltage, the high comparator having a high voltage threshold;
wherein the tuning logic controller for determining the voltage range of the tuning voltage is further configured to:
set the low voltage threshold to a first value from a list of voltages;
set the high voltage threshold to a second value from the list of voltages;
adjust the low voltage threshold higher to a first voltage based on the tuning voltage;
adjust the high voltage threshold lower to a second voltage based on the tuning voltage, the first voltage and the second voltage defining the voltage range of the tuning voltage for the first frequency.

13. The portable communications device of claim 12, wherein after programming the phase locked loop to the second frequency, the tuning logic controller is further configured to:
- set the low voltage threshold to the first value from the list of voltages;
- set the high voltage threshold to the second value from the list of voltages;
- adjust the low voltage threshold higher to a third voltage based on the tuning voltage;
- adjust the high voltage threshold lower to a fourth voltage based on the tuning voltage, the third voltage and the fourth voltage defining a voltage range of the tuning voltage for the second frequency;
- determine a gain of the voltage controlled oscillator based on the first frequency, the second frequency, an average of the voltage range of the first frequency, and an average of the voltage range of the second frequency; and
- program a charge pump current of the charge pump corresponding to the gain of the voltage controlled oscillator to achieve desired phase locked loop bandwidth.

\* \* \* \* \*